United States Patent [19]

Beeck

[11] E Re. 30,094

[45] Reissued Sep. 11, 1979

[54] OPTOELECTRONIC SWITCH

[75] Inventor: Carlos L. Beeck, Aloha, Oreg.

[73] Assignee: Tektronix, Inc., Beaverton, Oreg.

[21] Appl. No.: 846,733

[22] Filed: Oct. 31, 1977

Related U.S. Patent Documents

Reissue of:

[64] Patent No.: 3,946,225
Issued: Mar. 23, 1976
Appl. No.: 492,625
Filed: Jul. 29, 1974

[51] Int. Cl.[2] ..... G01D 5/34

[52] U.S. Cl. ..... 250/229; 250/211 K; 340/365 P

[58] Field of Search ..... 250/211 K, 237 R, 237 G, 250/229, 568, 570, 239; 235/61.11 E; 340/365 P

[56] References Cited

U.S. PATENT DOCUMENTS

| | | | |
|---|---|---|---|
| 2,519,688 | 8/1950 | Mitchell | 250/570 |
| 3,194,967 | 7/1965 | Mash | 250/211 K |
| 3,234,394 | 2/1966 | Worden | 250/237 R |
| 3,334,237 | 8/1967 | Dodsworth et al. | 340/365 P |
| 3,465,099 | 9/1969 | Harris | 250/237 R |
| 3,540,040 | 11/1970 | Sheane | 340/347 P |
| 3,610,939 | 10/1971 | Fitzgerald | 250/229 |
| 3,742,486 | 6/1973 | Skidmore | 340/347 P |
| 3,745,352 | 7/1973 | Low et al. | 250/239 |
| 3,811,047 | 5/1974 | Shragal | 250/211 K |
| 3,818,485 | 6/1974 | Harrison et al. | 340/365 P |

FOREIGN PATENT DOCUMENTS 1132118 10/1968 United Kingdom .

*Primary Examiner*—David C. Nelms
*Attorney, Agent, or Firm*—John D. Winkelman

[57] ABSTRACT

A light actuated switch apparatus is described in which no movable switch contacts are employed. The switch uses a light source and shutter to activate an array of light sensitive devices to generate a binary code that provides the switching function. One embodiment of the switch apparatus is employed inside a control knob providing a binary code generated by shutter action of a light source on an array of photo-transistors. Another embodiment [employes] *employs* the above control knob including switch apparatus as well as a second knob and printed board to form a dual switch apparatus. As no switch contacts are employed there is considerable reduction in electrical components. Additionally, this also greatly reduces the space required for mounting the switch, is readily serviceable or replaceable as no parts are located within an instrument, and is less expensive as no contacts eliminate any wear and potential problems associated with movable through stationary contacts.

7 Claims, 9 Drawing Figures

OPTOELECTRONIC SWITCH

Matter enclosed in heavy brackets [ ] appears in the original patent but forms no part of this reissue specification; matter printed in italics indicates the additions made by reissue.

BACKGROUND OF THE INVENTION

Previously, several switches have been made which relate in general to electrical circuits whether singular or in a dual assembly in which two different switches are operated independently by means of a common shaft or which can be operated together. In these switches, [their] *there* exists a stationary stator plate and a movable rotor plate properly positioned to change the electrical connections of the switch contacts by rotational or longitudinal movements of a knob device secured to the common shaft. Thus, a disadvantage arises due to wear of moving parts, namely between the stationary stator plate and the movable rotor plate as the knob device is moved. Another disadvantage inherent to these switches is that many require elaborate provisions be made if they are to intrude into an instrument and occupy significant space. Another disadvantage is that three dimensional cabling is required. Typical of the above described switches are the switches fully described in U.S. Pat. Nos. 3,074,011; 3,181,086; 3,187,118 and 3,207,861 all of which are assigned to the assignee of the present invention. Another type switch apparatus employs its movable and fixed switch contacts on a printed circuit board providing the electrical circuit to which the switch contacts are connected as fully described in U.S. Pat. No. 3,562,464 by Charles Howard Vollum et al and assigned to the assignee of the present invention. Such apparatus, however, requires significant space, and is subject to wear.

The application of encoding-decoding by light source, mask and photoreceptors is also well known in the art. For example, U.S. Pat. No. 3,491,244 by V. E. Stewart, Jr. describes an encoder for use in an automatic remote meter reading system which includes a plurality of photo cells disposed between a pair of coded discs and are arranged to be selectively energized from their opposite sides by individual illuminating means associated with each disc. Typical of the encoders and decoders employing coded discs having light openings in a radial array representative of the binary code, such that the position to which the disc is rotated relative to a fixed light source provides an indication in binary form are taught by U.S. Pat. Nos. 3,489,907; 3,740,721; 3,399,297; 3,237,012; and 3,512,006. Thus a disadvantage is that such use of encoding-decoding by light source, mask and photoreceptors are not applied to a switch.

SUMMARY OF INVENTION

The switch apparatus of the present invention relates generally to electrical switches and in particular to optoelectronic switches in which light from a light source is directed by means of a baffle and is interrupted by a shutter having a preselected pattern to pass the light in the form of a binary code onto an array of photo sensitive devices that uses the binary coded light to thus generate a binary code used to drive associated circuitry such as, for example, TTL logic circuits. The switch apparatus is built inside a control knob and uses no movable contacts.

It is therefore an object of the present invention to provide a new and improved electrical switch having no movable contacts.

It is another object of the present invention to provide a switch apparatus within a knob.

It is yet another object of the present invention to provide an optoelectronic switch requiring a minimum of space.

It is still another object of the present invention to provide switch apparatus of long, useful lifetime having no movable contacts.

It is still yet another object of the present invention to provide a plurality of switches within a plurality of control knobs.

The subject matter of the present invention is particularly pointed out and distinctly claimed in the following description. The invention, however, both to organization and method of operation together with further advantages and objects thereof may best be understood by reference to the following description taken in connection with the accompanying drawings. It is to be understood, however, that these embodiments are not intended to be exhausting nor limiting of the invention but are for the purposes of illustration in order that others skilled in the art may fully understand the invention and principles thereof and the manner of applying it in particular use so that they may modify it in various forms, each as may best be suited to the conditions of the particular use.

DETAILED DESCRIPTION OF INVENTION

Figure 1:
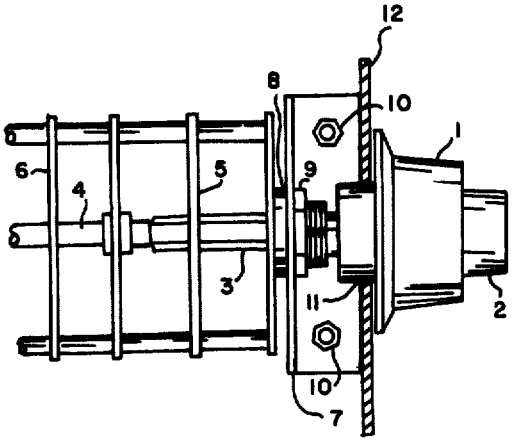
Fig-1 PRIOR ART
FIG. 1 is a partial side elevation of a typical electrical switch in accordance with the prior art.

Referring now to the drawings, and in particular to FIG. 1, there is shown a side elevation of an electrical switch assembly in accordance with the prior art, namely U.S. Pat. No. 3,187,118 previously mentioned. The switch includes knob devices 1 and 2, connected to a first switch shaft 3 and a second switch shaft 4. The first shaft 3 is such that second shaft 4 can rotate inside the first shaft. Each of these shafts actuate different switch devices and such switch devices may be of any type where electrical connections can be controlled by the rotation of a switch shaft. In the example shown, a first switch device 5 is actuated by the first switch shaft 3 and the second switch device 6 is actuated by the second shaft 4. The two shafts 3, 4 are supported in an L-shaped support bracket 7 by a sleeve member 8 in which the shaft 3 is journaled for rotation and also held against endwise movement with respect to the sleeve member. The sleeve member 8 has a screw-threaded end extending through the bracket 7. A nut 9 on such end secures the sleeve member in position in the support bracket. The support bracket 7 is mounted in an instrument chassis by means of a pair of nut, bolt and lock washer assemblies 10 so that the switch shafts extend through an opening 11 in the control panel 12 of the instrument and are connected to the knob devices 1, 2 on the front of such panel.

Figure 2:
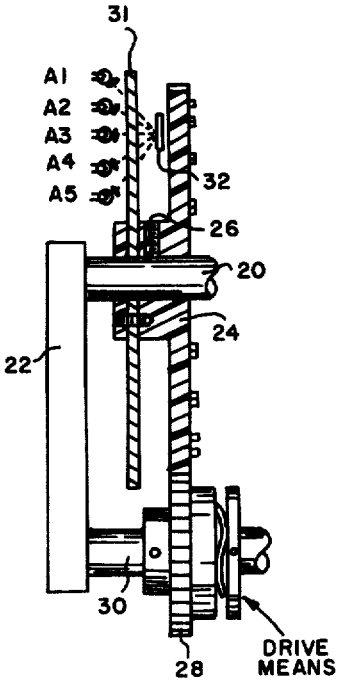
Fig-2 PRIOR ART
FIG. 2 is a partial cross-section view of an apparatus using a plurality of photo cells, light sources and coded discs in accordance with prior art.

Shown in FIG. 2 is a cross-sectional view of an apparatus utilizing a coded disc having light openings, in a radial array disposed between a light source and a plurality of photo cells in accordance with the prior art, namely U.S. Pat. No. 3,399,297 previously mentioned. A central shaft 20 has its outer end supported in a bearing block 22. Secured to the shaft 20 is a nylon gear 24 which is secured to the shaft by means of a set screw 26. The gear 24, in turn, meshes with gear 28 which is slideably received on a main drive shaft 30, the main drive shaft 30 being driven by means of say, a control knob, etc. Secured to its hub portion, the gear 24 carries a coded disc 31. Radially spaced along one side of the coded disc 31 are a plurality of light sources or lamps A1–A5. These lamps are such as to direct beams of light against a photocell element 32 positioned on the side of the disc 31 directly opposite the lamps A1–A5. The photocell will conduct an electrical current in accordance with the amount of light received from the lamps A1–A5 via the coded disc 31, such current being in a binary code and can be used to drive associated circuitry.

Figure 4:
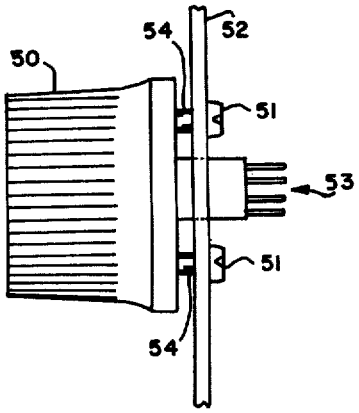
FIG. 4 is an isometric view of the optoelectronic switch in accordance with FIG. 3 mounted on, say, the front-panel portion of an instrument.

As can be discerned from the above described prior art switches and optoelectric devices, a combination optoelectric switch could be made by those skilled in the art. However, the disadvantages of such a combination i.e., space requirements great and wear of gear elements, etc., have not been overcome. Thus, in order to satisfy a concept of instrumental design to provide a switch which overcomes the disadvantages of the prior art, there is shown in FIG. 3 an isometric exploded drawing of the optoelectronic switch according to the present invention; FIG. 4 is an isometric drawing of the switch shown in FIG. 3 mounted on, say, the front-panel portion of an oscilloscope. Briefly considering the drawings shown in FIGS. 3 and 4, the entire switch assembly is mounted within a knob shell 50 and attached to the panel portion 52 of an instrument via securing members 51 such as screws, etc., received by connection members 54. A plurality of stationary contact members 53 are provided for inputing and outputing the electric switching current used to drive or to be received by associated circuitry.

Figures 3A, 3B, 3C, 3D, 3E:
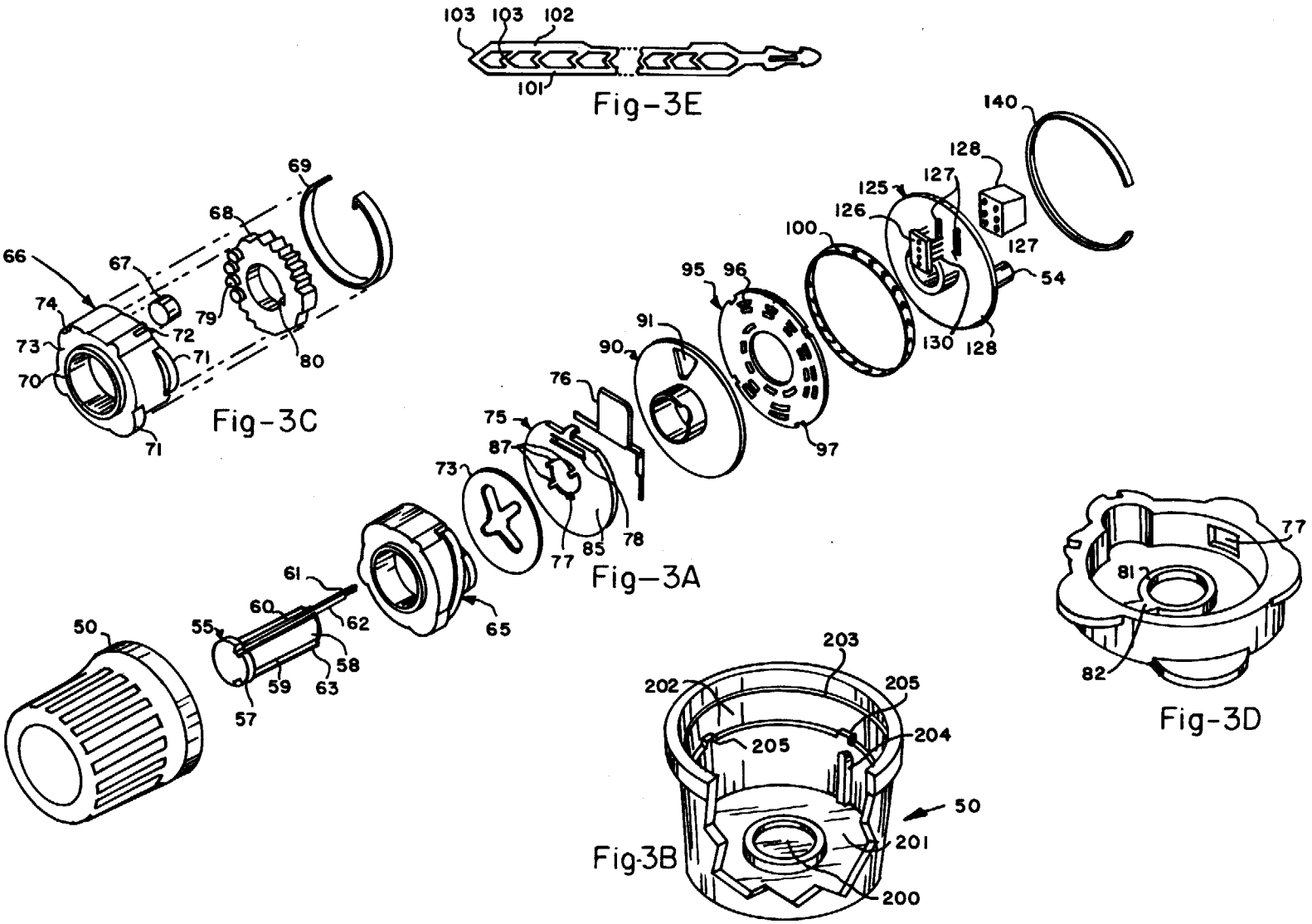
FIGS. 3A–3E are an exploded isometric drawing of the optoelectronic switch according to the present invention.

Referring specifically to FIG. 3A, for disposal into knob shell 50 are the components of the optelectronic switch including a shaft assembly 55, detent follower and stop assembly 65, spring member 73, light holder assembly 75, baffle member 90, coded disc member 95, spring and spacer member 100, light collector assembly 125 and a retaining spring member 140. Thus, the length of the knob shell 50 is determined by the components required. In the particular embodiment shown, it has been found that a length of ¾ inch provides a knob shell compatable with other traditional knob shells. Knob shell 50 is preferably formed as a single unit from a suitable plastic such as glass filled polycarbonate. FIG. 3B shows that the knob shell 50 includes a plurality of recessed areas 200, 201, 202 and 203. A guide portion 204 protrudes towards the knob center in the recess area 201 and will be discussed shortly. A plurality of guide stubs 205 protrudes upwards in the recess area 202, such stubs will also be described later in this description. The recess area 203 accepts the already mentioned retaining spring member 140. The recess area 200 is provided for receiving the shaft assembly 55, such shaft assembly having a ridge area 57 and an elongated area 58 extending orthogonally from the ridge area 57. Disposed into the elongated area 58 and traversing therealong are a plurality of grooves 59 and 60. As will be described later, a dual switch apparatus is provided which uses a similar, but longer shaft. Alternatively, however, the area of the elongated area 58 of shaft member 55 can be determined so that such area is suitable to allow a coaxial shaft inside it. Thus, ridge area 57 and the recess area 200 of knob shell 50 are dimensionally established. Disposed into the groove 60 is a contact blade 61 which forms one of a plurality of stationary contacts 53 (see FIG. 4) for the optoelectronic switch. Such blade is a conductive member, preferably metal, molded to an insulator member 62, which is preferably plastic, then attached to the shaft in the groove 60. Electrically, the contact blade 61 will not be at the same potential as the shaft due to the insulative characteristics of the plastic insulator member 62. As contact blade 61 forms a stationary contact, it is indeed obvious that when ridge area 57 is disposed into the recess area 200 of knob shell 50, no mechanical rigidity will exist therebetween. Disposed into the second groove 59 is a machine key 63, such key extending above the surface of the elongated area 58 and traversing therealong for providing a guide and lock assembly for the switch components. The use of a machine key is quite well known to those in the field and therefore will not be described in detail.

A detent follower and stop assembly 65 is next provided and is shown in detail in FIG. 3C. Included are a housing member 66, detent roller member 67, detent gear member 68 and a detent locking spring member 69. Housing member 66 is preferably a single unit formed from thermoplastic such as nylon, and includes a hub portion 70, a plurality of spring member supports 71 alternately spaced around the periphery edges of the member and a spring slot 72. An alignment member of semicircle shape extends across the outer surface of the member and includes a groove 74. The inner portion of the housing member, shown in FIG. 3D, includes a second hub portion 81 and a wedge shaped gear stop member 82. An aperture 77 is provided in the housing member and extends from the inner surface to the outer surface, such aperture for accepting the detent roller member 67. Detent gear member 68 is provided with a plurality of protuberances 79 for contacting the wedge gear stop member 82 and a groove 80 for accepting the machine key way discussed; such member preferably a single unit molded from an acetal-plastic such as DELRIN. The outer periphery of the gear is provided with a plurality of spaced indentations to define gear teeth. Detent lacking spring member 69 is a circular shaped spring member having one of its ends turned in a direction for disposal into the slot 72. Such spring will positively secure detent roller member 67 into one of the gear teeth.

The entire detent follower and stop assembly 65 is then placed over the elongated area 58 of the shaft assembly 55 and made to contact the ridge area 57 via hub portion 70. As the shaft assembly 55 is disposed into the recess area 200 of knob shell 50, the guide portion 204 engages the groove 74. As can now be discerned, the detent follower assembly 65 will advance with rotation of knob shell 50 whereas shaft assembly 55 remains stationary relative thereto. A next conventional spring member 73 of circular shape insures gear member 68 remains fixed within the housing member 66.

Light holder assembly 75 including a light source 76 is next carried by shaft assembly 55 and is held into position by the machine key 63 via the groove 77 provided in the assembly. As is well known from prior art, the light source must be accurately positioned in relation to the light collector (to be described later). In the prevent invention, the light source is provided by light emitting didoes (LED's) installed on a lead frame and encapsulated by transfer molding in transparent epoxy with integrally molded focusing lenses. The LED's thus packaged are secured onto a carrier base 85 via a clip means 78 and soldered in place permanently, one lead onto the metal circular shaped carrier base 85 and the other lead to contact blade 61. A plurality of tabs 87 provide electrical contact between carrier base 85 and the elongated area 58 of shaft assembly 55. Although the preferred embodiment uses an LED array for providing electromagnetic radiation, another arrangement can be a lamp and colluminating mirror, etc., all of which are well known. A next unit carried by and keyed to shaft assembly 55 is a light source baffle member 90. Baffle 90 is preferably formed as a single unit whose composition is similar to the housing member 66 and includes an opening 91 of desired shape therethrough so that when properly keyed on the shaft assembly, will funnel the electromagnetic radiation through the aperture from the light source means and block such electromagnetic radiation otherwise.

A binary coded shutter disc member 95 has therein chemically milled holes 96 in a preselected pattern to selectively pass the funneled electromagnetic radiation via baffle 90. Shutter disc member 95 therefore can be considered as a means to selectively damp, or mask, the electromagnetic radiation in accordance with a preselected pattern required for the desired switching. Around the periphery such disc are a plurality of alignment means 97 which engage with guide stubs 205 located in knob shell 50. Thus, the binary coded shutter disc member 95 also rotates with knob shell 50. It should be noted that the disc is preferably a metal which is processed after the chemical milling of the holes to provide a black oxide coating for light purposes, but that such preferable structure is not intended to be limiting and that any structure to provide the damping required would be possible.

Next provided within the switch apparatus is a spacer spring member 100 which holds shutter disc 95 in engagement with the guide stubs 205 located in knob shell 50. In addition such spacer spring provides electrical isolation between such shutter disc and an electromagnetic radiation collector, or detector or sensitive, means which will be discussed shortly. In order to [accomodate] *accommodate* both of the aforementioned [criterion] *criteria*, spacer spring member 100 is preferably a chemically milled "MYLAR" polyester and shown in detail in FIG. 3E. Two parallel support members 101 and 102 are connected together via a plurality of V-shaped truss members 103. Each of the parallel supports has one end which is truncated inwardly towards each other a minute amount, then again parallel. The truncated end portion provides the spacer-spring member with a connecting means. As shown in FIG. 3A, such spring is circular in shape and provided as such by weaving the connecting means first between two of the plurality of V-shaped truss members, then over one, and back between any adjacent two. Thus, connecting requires that the truncated end portion have a width slightly less than the width of the V-shaped truss members. It has been determined that the V-shaped truss members provide a spring whose stress-strain relationship follows a linear path and has good spring-back characteristics as required. It is to be understood however, that the spring as shown is one of many forms and is the preferred form. For instance, the V-shaped truss members can take various shapes and the truncated end portion can traverse outwardly, etc. The spring can be formed, a plurality at a time, very simply and inexpensively. Additionally, the length of such member can vary depending upon the design characteristics required.

A next portion of the switch apparatus which is keyed to and guided by shaft assembly 55 is the light collector assembly 125 which includes a radiation collector, or detector or sensitive, means 126 mounted thereon. A plurality of openings 127 through a metal disc portion 128 enable contact means 130 (stationary contact means 53 shown in FIG. 4), which are a portion of the radiation collector, or detector or sensitive means 126, to be received through an insulator and support member 129. A plurality of connection members 54 are provided for mounting the entire switch assembly onto an instrument panel or the like as previously shown and described. The radiation collector, or detector or sensitive, means 126 collects the masked electromagnetic radiation and provides an output proportional to such masked radiation. In the present invention, such radiation collector, or detector or sensitive, means 125 [is] is an array of 5 phototransistor chips mounted on a lead frame, wired in parallel and encapsulated by transfer molding in transparent epoxy with integrally molded focusing lenses as well as mounting stubs in a manner resembling a dual-in-line DIP package suitable for [pluging] *plugging* into an etched circuit board, soldering or other conventional connection means. Other types of collector means can be used which are well known in the art such as, for example, charge coupled devices (CCD's). The requirement for such substitution radiation collector, or detector or sensitive means requires that an output [porportional] *proportional* to the masked electromagnetic radiation be produced. The entire switch apparatus is completed when a conventional retaining spring member 140 is disposed into the recessed area 203 of knob shell 50.

In the preferred embodiment of the above described switch apparatus, the knob switch is made with five elements in the optoelectronic array, thus is capable of 25 or 32 coded positions; a switch having 32 positions would have 11¼° per step. A switch having, say, 18 positions or 20° per step would, of course, have the detent steps more defined relative to the 32 position switch. The desired number of switch positions are determined by the number of teeth provided on the detent gear member 68 and the traverse of the switch is determined by the stop protuberancies 79.

Figure 5:
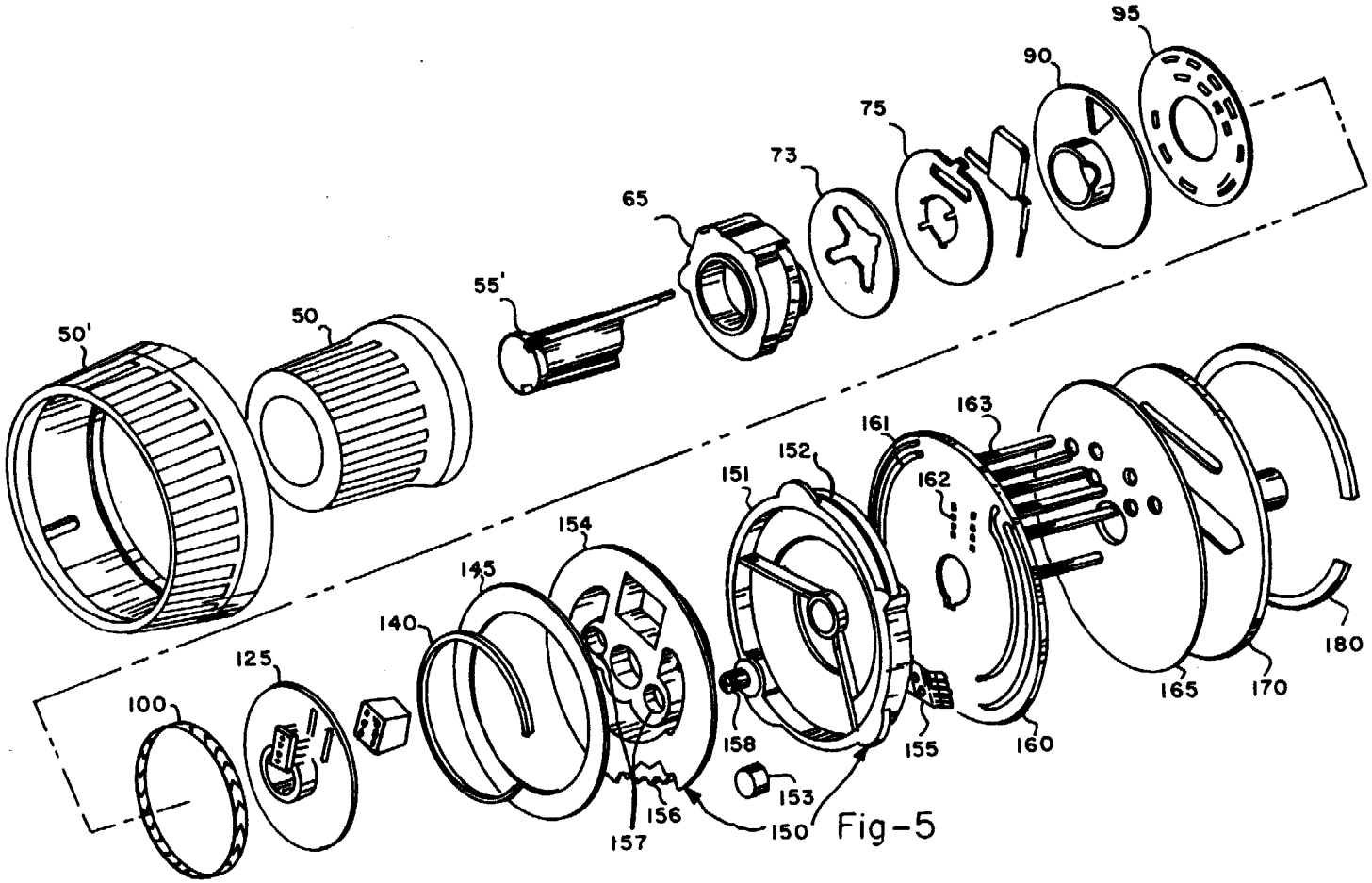
FIG. 5 is an isometric view of a dual optoelectronic switch according to the present invention.

Shown in FIG. 5 is an isometric view of a dual optoelectronic switch according to the present invention. Such switch apparatus includes the previously mentioned knob shell 50, shaft assembly 55', detent follower and stop assembly 65, spring member 73, light holder assembly 75, baffle member 90, coded disc 95, spring and spacer 100, light collector assembly 125 and the retaining spring 140. In addition, a second knob shell 50', indicator panel 145, a second detent follower and stop assembly 150, circuit board member 160, insulator 165, and additional mounting member 170, and a second retaining spring member 180. A minor difference exists however, between the shaft assembly 55 and shaft assembly 55' of FIG. 5, the latter having an elongated area of greater length to accommodate the extra components of the dual switch. As previously mentioned, another alternative would be a coaxially mounted shaft within the elongated area to accommodate the extra components of the dual switch. Knob shell 50' includes a recess area into which a retaining spring 180 is disposed and as such, must be of sufficient length and area so that knob shell 50 can be rotated when disposed therein as in any type dual switch. Indicator panel 145 when secured by, say, contact cement or other conventional securing means to the second detent and stop assembly 150 provides an indication as to the switch position defined by rotation of inner knob shell 50. Detent follower and stop assembly 150 consists of a housing member 151, a spring member 152, a roller member 153, a detent wheel member 154 and a contact member 155. Detent wheel member 154 is provided with a plurality of holes 157 which have one end beveled (not shown), such holes for receiving the connection members 54 (see FIG. 3A) on the light collector assembly 125. A plurality of securing means such as the screw 158 connects the units together, such a screw being disposed into the beveled end for obvious reasons. In addition, the detent wheel member includes gear teeth members 156 into which the detent roller 153 is engaged. As the assembly differs only slightly from that already described no further description will be given. A switch contact member 155 is carried by the housing member 151 for contacting circuit board conductive areas or a circuit board member to be next discussed; as the contact is well known it will not be discussed in detail. The remainder of the detent and stop assembly 150 is similar to the detent follower and stop assembly 65 and as such will not be discussed.

A circuit board member 160 is next carried by the shaft assembly 55' and includes a plurality of etched circuit board conductive areas 161. These areas or paths are preselected to provide the desired switching functions. The circuit board also includes a plurality of aperatures 162 for receiving the contact members of the light collector, or detector or sensitive means already discussed. A plurality of conductive members 163 are also provided on the circuit board to provide the electric path required by such switch for inputing and outputing the desired switching currents. An insulator member 165 provides insulation between circuit board member 160 and the mounting member 170. Mounting member 170 is similar to light collector assembly 125 except no light collector, or detector or sensitive member is provided. Again, a spring member 180 when placed into the recess area of knob shell 50' completes the assembly.

While there has been shown and described the preferred embodiments of the present invention, it will be apparent to those skilled in the art that many changes and modifications may be made without departing from the invention in its broader aspects. For example, two complete optoelectronic switches, say as described in FIG. 3 could be connected in a dual switch assembly. Therefore, the appended claims are intended to cover all such changes and modifications that fall within the true spirit and scope of the invention.

The invention is claimed in accordance with the following:

[1. An optoelectronic switch, comprising:

a movable housing member, stationary radiation source means disposed inside said movable housing member, said stationary radiation source means for providing electromagnetic radiation;

movable masking means operably disposed in said movable housing member, said masking means for selectively masking said electromagnetic radiation to provide a coded electromagnetic radiation; and stationary radiation sensitive means disposed inside said movable housing member, said stationary radiation sensitive means for collecting said coded electromagnetic radiation to provide an output electrical signal proportional to said coded electromagnetic radiation.]

[2. The switch according to claim 1 further comprising:

connecting means disposed within said movable housing member, said connecting means for connecting said movable housing means and said movable masking means together.]

[3. The switch according to claim 2 wherein said movable housing member defines a knob member.]

[4. The switch according to claim 1 wherein said stationary radiation source means defines a light member.]

[5. The stationary radiation source member according to claim 4 wherein said light member defines a light emitting diode.]

[6. The switch according to claim 1 wherein said movable masking means defines a shutter means.]

[7. The movable masking means according to claim 6 wherein said shutter means defines a coded shutter member coded in a preselected pattern.]

[8. The switch according to claim 1 wherein said stationary radiation sensitive means defines a light sensitive member.]

[9. The switch according to claim 8 wherein said light sensitive member defines a phototransistor.]

[10. The switch according to claim 8 wherein said light sensitive member defines a charge coupled device.]

11. An optoelectronic switch, comprising:

a first movable housing member;

a second movable housing member operatively disposed within said first movable housing member;

stationary radiation source means disposed within said second movable housing member, said stationary radiation source means for providing electromagnetic radiation;

movable masking means operatively disposed in said second movable housing member, said movable masking means for selectively masking said electromagnetic radiation to provide a coded electromagnetic radiation;

stationary radiation [sensative] *sensitive* means disposed inside said second movable housing member, said stationary radiation sensitive means for collecting said coded electromagnetic radiation to provide an electrical signal proportional to said coded electromagnetic radiation; and means operatively disposed inside said first housing member, said means for selectively receiving said [electricl] *electrical* signal to provide a selectable electrical signal.

12. The switch according to claim 11 wherein said first and said second movable housing members move independently from one another.

13. The switch according to claim 11 wherein said means operatively disposed inside said first movable housing member defines a circuit board means including selectable connection members.

*14. An optoelectronic switch, comprising*

*a rotatable housing,*

*a masking member mounted within and coupled to said housing for rotation therewith, said member including a plurality of light transmissive windows,*

*stationary light sensitive means disposed within said housing facing one side of said masking member for detecting incident light and generating an electrical signal proportional thereto, and*

*stationary light source means disposed within said housing facing the opposite side of said masking member for directing light toward said light sensitive means,*

*light from said source means passing through certain of said windows at different rotational positions of said housing to illuminate said light sensitive means and thereby produce electrical output signals at such positions.*

*15. The switch of claim 14, further including detent means within said housing for indexing said masking member at different rotational positions.*

*16. The switch of claim 14, wherein said masking member comprises a disc mounted for axial rotation, said windows being disposed in a selected pattern in the disc to provide different electrical output signals at different rotational positions.*

*17. The switch of claim 14, wherein said light sensitive means comprises a plurality of photodetectors and said light source means comprises a like plurality of light emitting devices, each directing light toward a different one of said photodetectors, different individual ones and groups of said photodetectors being illuminated by light passing through said windows at different rotational positions of the housing to generate different, coded electrical signals at such positions.*

* * * * *